United States Patent
Fukami

(10) Patent No.: US 6,633,469 B2
(45) Date of Patent: Oct. 14, 2003

(54) POWER SEMICONDUCTOR CIRCUIT

(75) Inventor: Ikuo Fukami, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 205 days.

(21) Appl. No.: 09/804,296

(22) Filed: Mar. 13, 2001

(65) Prior Publication Data

US 2001/0022715 A1 Sep. 20, 2001

(30) Foreign Application Priority Data

Mar. 14, 2000 (JP) ........................................ 2000-076307

(51) Int. Cl.[7] ................................................. H02H 3/20
(52) U.S. Cl. ............................ 361/86; 361/78; 361/115
(58) Field of Search ........................................ 361/86, 78

(56) References Cited

U.S. PATENT DOCUMENTS 6,272,573 B1 * 8/2001 Coale et al. ................ 710/100
6,304,180 B1 * 10/2001 Platner et al. .............. 340/567

FOREIGN PATENT DOCUMENTS

| JP | 05-284000 | 10/1993 |
| JP | 06-104732 | 4/1994 |

OTHER PUBLICATIONS

"Malik, NorbertElectronics Circuits, Analysis, Simulation and Design 1995 p. 307".*

Gibilisko,Stan "The Illustrated Dictionary of Electronics" Eight Edition 2001 p. 137.*

* cited by examiner

*Primary Examiner*—Gregory J. Toatley, Jr.
*Assistant Examiner*—Isabel Rodriguez
(74) *Attorney, Agent, or Firm*—McGinn & Gibb, PLLC

(57) ABSTRACT

A power semiconductor circuit drives a load connected an output terminal. An output switch switches the output terminal to either one of an on-state and an off state. An internal state signal terminal produces an internal state of the circuit as a signal. An internal state signal switch switches the internal state signal terminal to either one of an on-state and an off-state. An internal state sensor detects the internal state of the circuit. A logic circuit is given with a control signal from an external control circuit, a detecting signal of the internal state sensor, and the signal from the internal state signal terminal, and switches the output switch and the internal state signal switch to either one of the on-state and the off-state on the basis of the given signals.

20 Claims, 6 Drawing Sheets

POWER SEMICONDUCTOR CIRCUIT

BACKGROUND OF THE INVENTION

This invention broadly relates to a power semiconductor circuit (hereinafter, may be referred to as a power IC), and in particular, to a power IC suitable for driving a load on the condition that a plurality of power ICs are connected in parallel.

When a load is driven by using a plurality of power ICs, the power IC often operates exceeding its rating in the cause of an over-load. If such a state continues for a long time, the power IC will be damaged.

To avoid such a damage, the power IC has been conventionally provided with an internal state sensor for detecting an internal state thereof. With this structure, the output of the internal state sensor is given to a microcomputer in order to control the power IC.

For example, when the power IC is put into an abnormal state, the internal state sensor detects this state. Under this circumstance, the microcomputer cuts off an input signal for the power IC on the basis of the output of the internal state sensor. Thereby, the drive of the power IC is halted such that the damage against the power IC is avoided in advance.

Thus, the control due to the variation of the internal state of the power IC has been carried out by the use of the microcomputer in the conventional power IC. Consequently, the control of the microcomputer becomes complex, and capacitance of a memory for storing a control program is inevitably increased. Further, a load for the microcomputer is increased also.

In consequence, when the load is driven in parallel by using a plurality of power ICs to enhance driving ability of the load, the respective internal states of the power ICs must be identified by the microcomputer.

Further, when the power ICs are controlled, respectively, the number of terminals connected to the microcomputer is more increased.

Herein, it is assumed that a plurality of power ICs are driven in parallel. When either one of the power ICs has an abnormality, the drive of the corresponding power IC is halted.

Simultaneously, the drives of the other power ICs must be halted so as to prevent the damages of the other power ICs. In the case where such a control is carried out by the use of the microcomputer, the load of the microcomputer is remarkably increased.

Alternatively, it is assumed that the power IC itself has a self-halting function. Under this circumstance, the abnormality takes place for the power IC, the drive of the power IC will be halted by the self-halting function.

When the power ICs are driven in parallel, the drive of the power IC having abnormality is immediately halted by the self-halting function. In this condition, an abnormal signal of the power IC is once supplied to the microcomputer, and the other ICs are controlled after the microcomputer carries out an internal process.

Consequently, variation of timing may totally occur for the control of the power ICs. As a result, it is difficult to synchronize a plurality of power ICs to each other in order to enhance apparent current driving ability.

SUMMARY OF THE INVENTION

It is therefore an object of this invention to provide a power IC which is capable of immediately halting a drive of a power IC without increasing a load of a microcomputer when the power IC has an abnormality.

It is another object of this invention to provide to a power IC in which a plurality of power ICs are synchronized so as to enhance apparent current driving ability when the power ICs are driven in parallel.

According to this invention, a power semiconductor circuit drives a load connected an output terminal. An output switch switches the output terminal to either one of an on-state and an off state. An internal state signal terminal produces an internal state of the circuit as a signal.

An internal state signal switch switches the internal state signal terminal to either one of an on-state and an off-state. An internal state sensor detects the internal state of the circuit.

A logic circuit is given with a control signal from an external control circuit, a detecting signal of the internal state sensor, and the signal from the internal state signal terminal, and switches the output switch and the internal state signal switch to either one of the on-state and the off-state on the basis of the given signals.

With such a structure, the internal state signal terminal may be connected to a resistor.

Under this circumstance, the internal state signal terminal is kept to a first potential level when the internal state signal switch is put into the off-state while the internal state signal terminal is kept to a second potential different from the first potential level when the internal state signal switch is put into the on-state. In this event, the second potential level may be equal to a ground level.

Further, the logic circuit switches the output switch to either one of the on-state and the off-state based upon change of the potential level of the internal state signal terminal.

Preferably, a drive circuit switches the output switch to either one of the on-state and the off-state in response to a signal from the logic circuit.

The external control circuit may be a microcomputer. In this case, the microcomputer is given with the signal from the internal state signal terminal, and an input signal of the logic circuit being changed based upon the signal from the internal state signal terminal.

Herein, the output switch or the internal state signal switch may be structured by a MOS transistor.

More specifically, when the abnormality takes place for the internal state, the output switch is switched, and the supply of the power for the load is halted. At the same time, the internal state signal switch is switched, and the level of the internal state signal terminal is changed.

Thereby, the abnormality is avoided in the power IC itself to prevent the damage. Further, the load of the process during the abnormal state of the microcomputer can be reduced.

Moreover, when one power IC has the abnormality with respect to the internal state, the operation of the corresponding power IC is halted. At the same time, the operation of another power IC is halted by the signal from the internal state signal terminal of the corresponding power IC.

Consequently, the damages of all power ICs can be prevented without increasing the load of the microcomputer. Further, the apparent current driving ability can be enhanced in synchronism with all power ICs.

DESCRIPTION OF PREFERRED EMBODIMENTS

Figure 1:
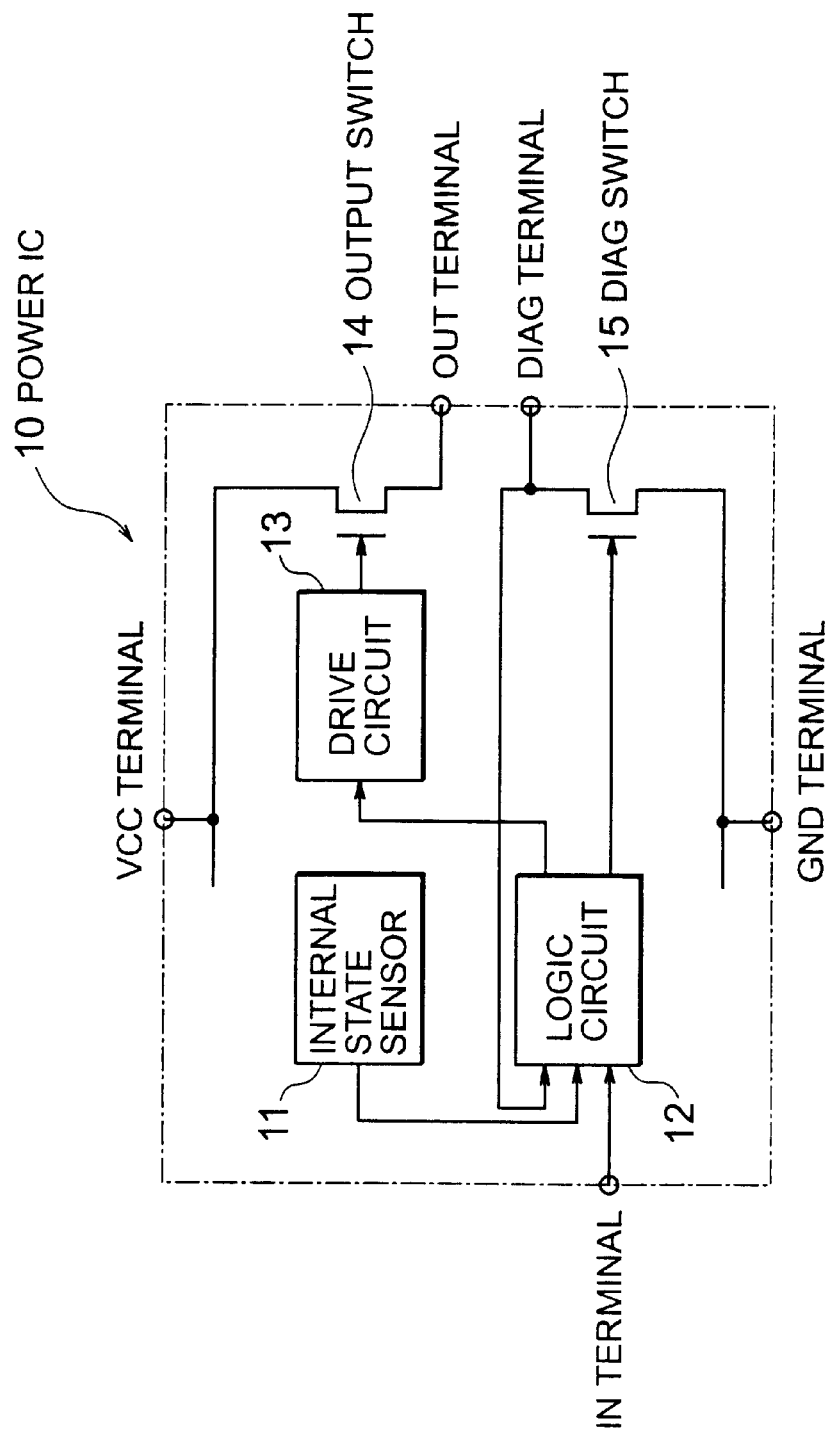
FIG. 1 is a block circuit diagram showing an internal circuit structure of a power IC according to this invention.

Referring to FIG. 1, description will be made about an embodiment of this invention.

A power IC 10 includes an internal state senser 11, a logic circuit 12, a drive circuit 13, an output switch 14, and a DIAG switch 15 as functional blocks.

Further, the IC power is provided with a power source terminal (hereinafter, may be referred to as a VCC terminal), a ground terminal (hereinafter, may be referred to as a GND terminal), an input terminal (hereinafter, may be called an IN terminal), an output terminal (hereinafter, may be called an OUT terminal), and an internal state signal terminal (hereinafter, may be referred to as a DIAG terminal).

With such a structure, the DIAG terminal produces a signal indicating an internal state of the power IC 10 into an external portion. The internal state sensor 11 monitors the internal state of the power IC 10 by the use of an internal voltage of the power IC 10, and supplies an internal error signal to the logic circuit 12 when the power IC exceeds the rating.

The logic circuit 12 is connected to a microcomputer (not shown) via the IN terminal, and is given with a signal from the microcomputer, a signal from the internal state sensor 11, and a signal of the DIAG terminal, respectively.

Further, the logic circuit 12 performs the predetermined calculation on the basis of the respective signals, and supplies a signal into the drive circuit 13 and the DIAG switch 15 in accordance with the calculation result.

The drive circuit 13 serves to turn on/off the output switch 14 based upon the signal from the logic circuit 12. The output switch 14 is preferably structured by a MOS transistor, and the signal from the drive circuit 13 is given to a gate of the MOS transistor serving as the output switch 14.

With this structure, the output switch 14 is switched to two states of an on-state and an off-state between the VCC terminal and the OUT terminal when the on/off control is carried out on the basis of the signal from the drive circuit 13.

Moreover, the DIAG switch 15 is also structured by the MOS transistor, and the signal from the logic circuit 12 is given to the gate of the MOS transistor serving as the DIAG switch 15.

In this condition, the DIAG switch 14 is switched to two states of an on-state and an off-state between the DIAG terminal and the GND terminal when the on/off control is carried out on the basis of the signal from the logic circuit 12.

Figure 2:
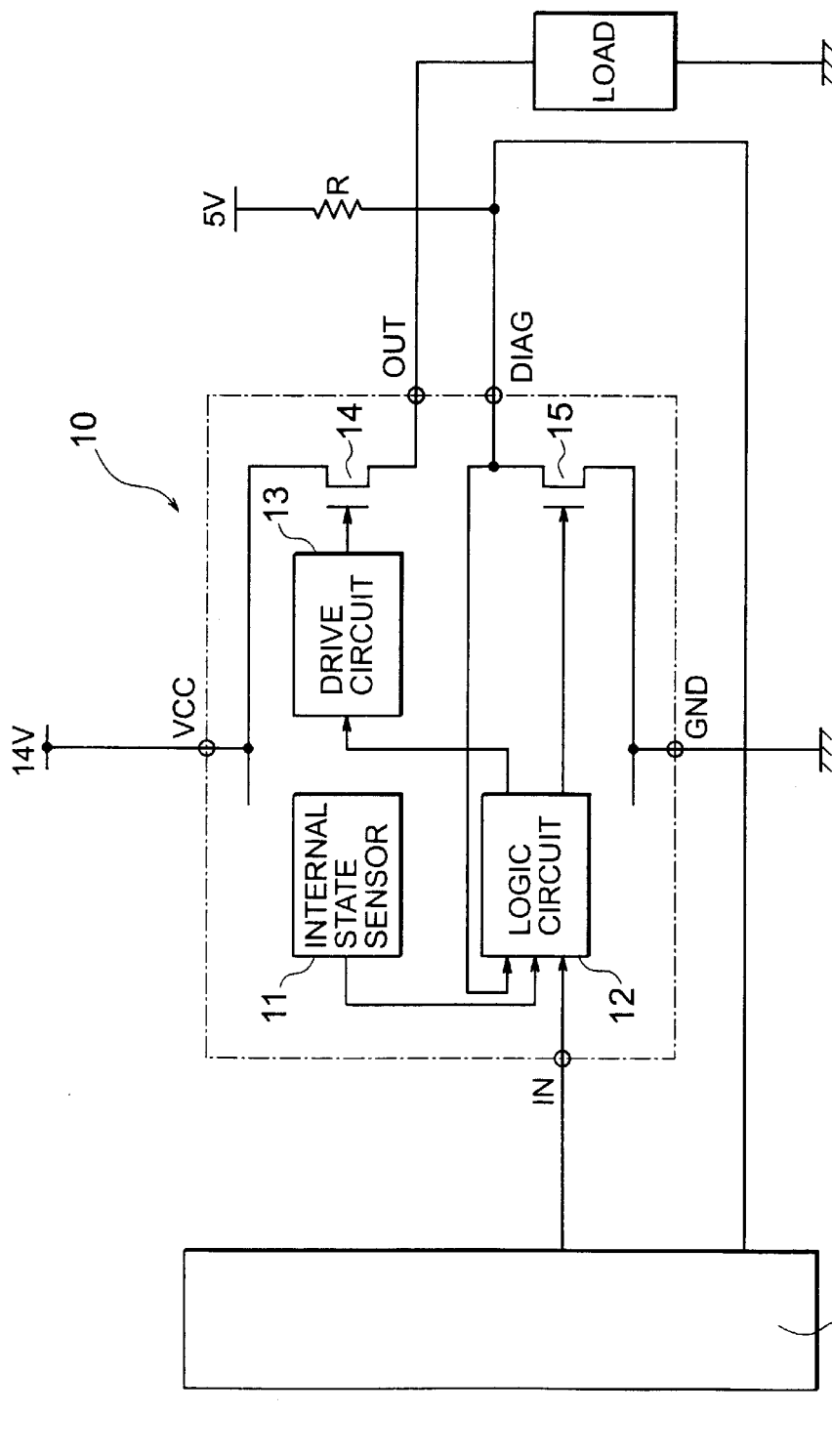
FIG. 2 is a circuit diagram showing a first embodiment of a circuit structure for driving a load by an power IC illustrated in FIG. 1.

Under such a circumstance, a load L is driven by the use of the power IC 10, as illustrated in FIG. 2.

Referring to FIG. 2, the IN terminal of the power IC 10 is connected to the microcomputer MC such that a driving signal is given from the microcomputer MC.

For example, a power supply of 14V is connected to the VCC terminal. Further, the load is connected to the OUT terminal. Herein, the load is driven by 14V defined as the voltage of the VCC terminal.

Moreover, the DIAG terminal is connected to a reference voltage of 5V via a pull-up resistor R. The DIAG terminal is connected to the microcomputer MC. With this structure, the internal state of the power IC 10 is given to the microcomputer MC via the DIAG terminal. In this event, the GND terminal is grounded.

Figure 3:
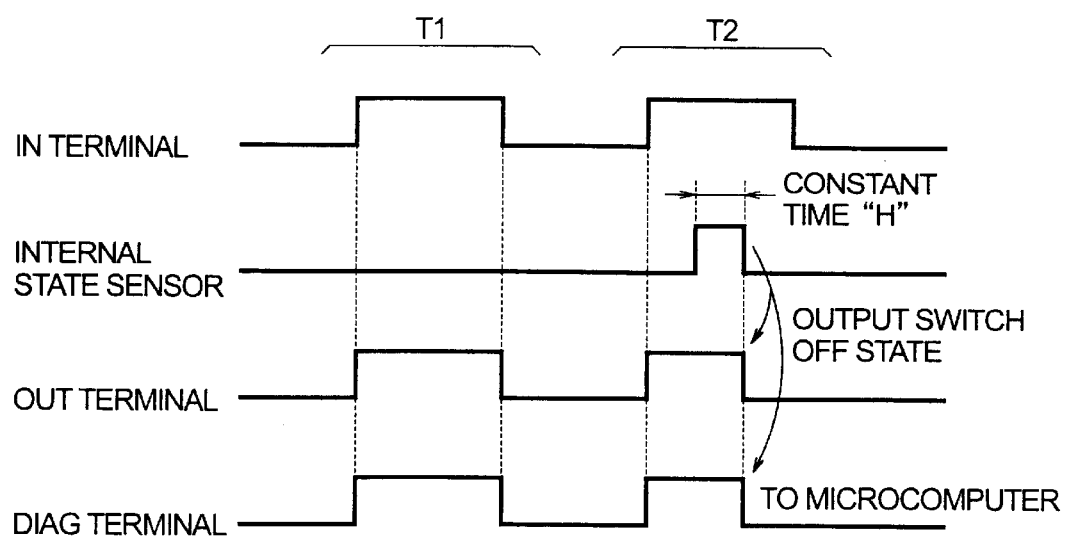
FIG. 3 is a timing chart for explaining an operation of a circuit illustrated in FIG. 2.

Referring to FIG. 3, description will be made about an operation of a load driving circuit illustrated in FIG. 2.

During a normal operation, when a signal "H" is given to the IN terminal from the microcomputer MC, as indicated by a TI region in FIG. 3, the signal is supplied from the logic circuit 12 to the drive circuit 13. Thereby, the drive circuit 13 turns on the output switch 14 on the basis of the signal.

As a result, 14 V is given to the OUT terminal from the VCC terminal, a current flows along the load L to drive the load.

During such a normal operation, the signal is not produced from the internal state sensor 11, and the logic circuit 12 maintains the DIAG switch 15 into the off-state. Consequently, the DIAG terminal is put into the level of 5V by the pull-up resistor R placed outside the DIAG terminal to produce the signal "H" into the microcomputer MC. The microcomputer MC judges that the power IC normally operates on the basis of the signal "H".

In the meantime, when the load L is put into an over-load state and the internal state of the power IC 10 exceeds the rating, the internal state sensor 11 detects this state and supplies the signal "H" into the logic circuit 12, as indicated by a T2 region.

The logic circuit 12 receives the signal "H" of the internal state sensor 11, and produces the predetermined signal to the drive circuit 13 when the signal "H" continues for constant time. The drive circuit 13 switches the output switch 14 to the off-state in response to the signal.

At the same time, the logic circuit 13 switches the DIAG switch 15 to the off-state. By the off-state of the output switch 14, the VCC voltage (14V) is not produced from the OUT terminal, and the current supply to the load L is halted.

Simultaneously, the DIAG terminal is put into the GND level by the on-state of the DIAG switch 15 to produce the signal "L" into the microcomputer MC. In consequence, the microcomputer MC detects that the power IC 10 has abnormality by the signal "L". Thereby, the microcomputer MC will control so as to halt the input of the signal into the IN terminal of the power IC 10. As result, the damage for the power IC 10 can be prevented in advance.

As described above, when the power IC 10 has the abnormality therein, the supply of the power to the load L is cut off on the basis of the signal from the internal state sensor 11. At the same time, the signal indicating the abnormality is given to the microcomputer MC.

When the microcomputer MC receives the signal indicting the abnormality, the microcomputer merely controls so as to halt the input of the signal for the power IC 10.

In consequence, the process of the microcomputer MC can be simplified, and the process can become high-speed. As a result, the damage for the microcomputer MC can be avoided in advance, and it is unnecessary to enlarge the microcomputer.

Figure 4:
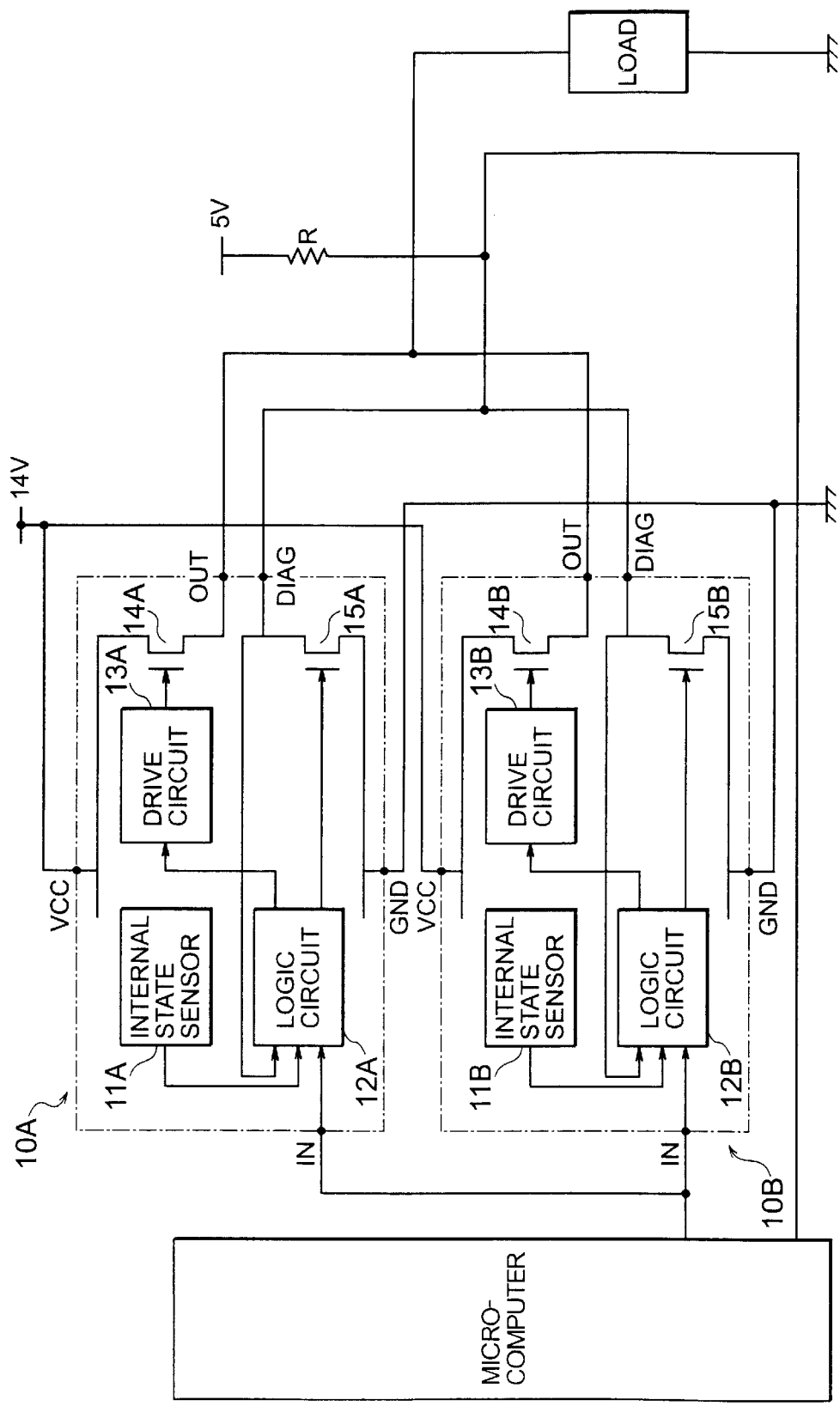
FIG. 4 is a circuit diagram showing a second embodiment of such a circuit structure that a plurality of power ICs are connected in parallel.

Referring to FIG. 4, a load L is driven in parallel using a plurality of power ICs 10A and 10B. Herein, it is to be noted that each internal structure of the two power ICs 10A and 10B is identical with the structure of the power IC illustrated in FIG. 1. Therefore, the detail description with respect to the same portions will be omitted hereinafter.

In the two power ICs 10A and 10B, the IN terminals, VCC terminals, the OUT terminals, the DIAG terminals, and the GND terminals are connected to each other, respectively.

With this structure, the signal from the microcomputer MC is given to the IN terminals of the power ICs 10A and 10B, respectively. Further, the current is supplied from the VCC terminals to the load L via the OUT terminals of the power ICs 10A and 10B. Consequently, current driving ability becomes twice in comparison with the circuit illustrated in FIG. 2.

Moreover, the DIAG terminals of the power ICs 10A and 10B are connected to the microcomputer MC on the condition that they are unified.

In such a microcomputer MC, the terminal for supplying the signals to the IN terminals of the power ICs 10A and 10B, and the terminal for inputting the signals from the DIAG terminals are identical with the circuit illustrated in FIG. 2. Consequently, the terminal number is not increased.

Figure 5:
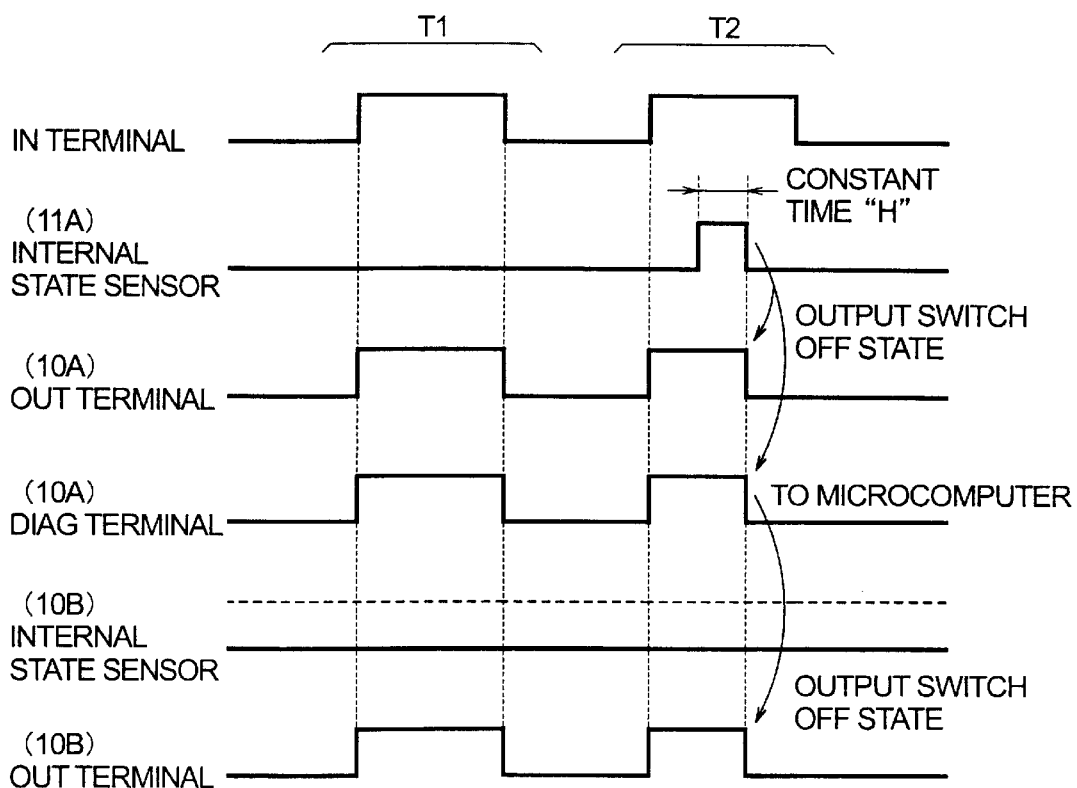
FIG. 5 is a timing chart for explaining an operation of a circuit illustrated in FIG. 4.

Referring to FIG. 5, description will be made about the operation of the load driving circuit in which the two power ICs 10A and 10B illustrated in FIG. 4 are connected in parallel.

During an normal operation, when a signal "H" is given to the IN terminals of the power ICs 10A and 10B from the microcomputer MC, as indicated in a TI region in FIG. 5, the signal is supplied from the logic circuits 12A and 12B to the drive circuits 13A and 13B. Thereby, the drive circuits 13A and 13B turns on the output switches 14A and 14B on the basis of the signal.

As a result, 14 V is given to the OUT terminals from the VCC terminals, a current flows along the load L. Thereby, the load L is driven with the load current from the power ICs 10A and 10B by twice driving current compared with the circuit illustrated in FIG. 2.

During such a normal operation, the signal is not produced from the internal state sensors 11A and 11B, and the logic circuits 12A and 12B keep the DIAG switches 15A and 15B into the off-state. Consequently, each of the DIAG terminals is put into the level of 5V by the pull-up resistor R placed outside the DIAG terminals to produce the signal "H" into the microcomputer MC. The microcomputer MC judges that the power ICs 10A and 10B normally operate on the basis of the signal "H".

On the other hand, it is assumed that the power IC 10A among the two power ICs 10A and 10B has the abnormality.

Under this circumstance, when the internal state sensor 11A in the power IC 10A detects that the internal state of the power IC 10A exceeds the rating, the internal state sensor 11A supplies the signal "H" into the logic circuit 12A.

When the signal "H" continues to being produced for constant time, the logic circuit 12A switches the output switch 14A to the off-state. At the same time, the logic circuit 12A switches the DIAG switch 15A to the on-state.

Thereby, the supply of the VCC power is halted from the OUT terminal, and the DIAG terminal is put into a "L" level. This "L" level signal is given to the microcomputer MC, and at the same time, puts the level of the DIAG terminal of another power IC 10B into "L".

In consequence, the microcomputer MC detects the abnormality of the power IC 10A, and halts producing the signal to the IN terminal.

Simultaneously, the DIAG terminal is put into "L" in another power IC 10B. Thereby, the logic circuit 12B receives this signal "", and supplies the predetermined signal to the drive circuit 13B, and turns off the output switch 14B.

In consequence, the supply of the VCC power is also halted from another power IC 10B, and the drive of the load is halted.

Thus, in the case where two of the power ICs 10A and 10B are connected in parallel, when one power IC 10A has the abnormality, the supply of the power is halted from the power IC 10A having the abnormality.

At the same time, the supply of the power is also halted from another power IC 10B having no abnormality in response to the signal from the power IC 10A having the abnormality.

Thereby, the drives of all power ICs 10A and 10B, which are driven in parallel, are halted without waiting the control of the microcomputer MC.

Further, each of the power ICs 10A and 10B is prevented being driven exceeding the rating in advance. In consequence, the damages of the respective power ICs 10A and 10B can be avoided.

Accordingly, a plurality of power ICs 10A and 10B can be controlled without increasing the process of the microcomputer MC. In particular, a plurality of power ICs 10A and 10B can be controlled in synchronism with the output switch 14. Thereby, the apparent current driving ability can be enhanced.

Figure 6:
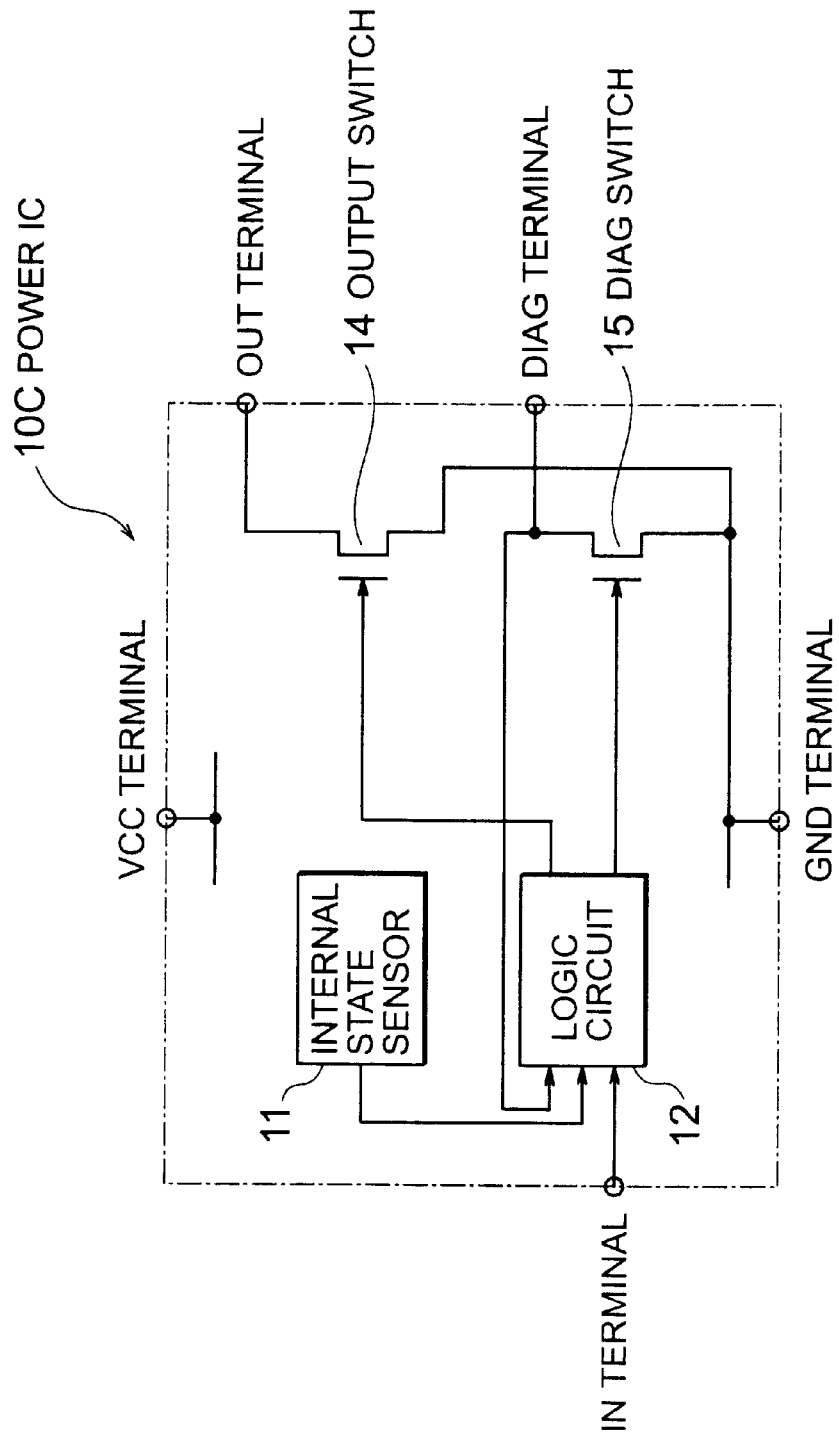
FIG. 6 is a block diagram showing an internal circuit structure of a modified example of a power IC according to this invention.

Although the VCC power is given to the OUT terminal in the power IC according to the above-mentioned embodiments, the OUT terminal may be connected to the GND terminal so as to drive the load L, like the power IC 10C illustrated in FIG. 6. Herein, it is to be noted that the same reference numbers are attached to the equivalent portions to the circuit illustrated in FIG. 1.

With such a structure, the output switch 14 can be directly controlled by the use of the output of the logic circuit 12. Thereby, the drive circuit can be omitted to simplify the circuit structure.

While the invention has thus far been disclosed in conjunction with several embodiments thereof, it will be readily possible for those skilled in the art to put this invention into practice in various other manners.

What is claimed is:

1. A power semiconductor circuit for driving a load connected to an output terminal, comprising:

an output switch which switches the output terminal to either one of an on-state and an off state;

an internal state signal terminal which produces an internal state of the circuit as a signal;

an internal state signal switch which switches the internal state signal terminal to either one of an on-state and an off-state;

an internal state sensor which detects the internal state of the circuit; and a logic circuit which is given a control signal from an external control circuit, a detecting signal of the internal state sensor, and the signal from the internal state signal terminal and which switches the output switch and the internal state signal switch to either one of the on-state and the off-state on the basis of the given signals.

2. A circuit as claimed in claim 1, wherein:
   the internal state signal terminal is connected to a resistor.

3. A circuit as claimed in claim 1, wherein:
the internal state signal terminal is kept to a first potential level when the internal state signal switch is put into the off-state, and
the internal state signal terminal is kept to a second potential different from the first potential level when the internal state signal switch is put into the on-state.

4. A circuit as claimed in claim 3, wherein:
the second potential level is equal to a ground level.

5. A circuit as claimed in claim 3, wherein:
the logic circuit switches the output switch to either one of the on-state and the off-state based upon change of the potential level of the internal state signal terminal.

6. A circuit as claimed in claim 1, further comprising:
a drive circuit which switches the output switch to either one of the on-state and the off-state in response to a signal from the logic circuit.

7. A circuit as claimed in claim 1, wherein:
the external control circuit comprises a microcomputer,
the microcomputer is given with the signal from the internal state signal terminal, and
an input signal of the logic circuit being changed based upon the signal from the internal state signal terminal.

8. A circuit as claimed in claim 1, wherein:
the output switch is structured by a MOS transistor.

9. A circuit as claimed in claim 1, wherein:
the internal state signal switch is structured by a MOS transistor.

10. A circuit as claimed in claim 1, wherein:
at least first and second of the power semiconductor circuits are driven in parallel so as to drive the load,
each of the first and second power semiconductor circuits has at least first and second output terminals, and first and second internal state signal terminals,
the respective power semiconductor circuits are connected in parallel via the first and second output terminals, and the first and second internal state signal terminals, and
a first signal from the first internal state signal terminal is given to the second power semiconductor circuit.

11. A circuit as claimed in claim 10, wherein:
the first and second output terminals are connected to the load.

12. A circuit as claimed in claim 10, wherein:
the first and second internal state signal terminals are connected to a resistor.

13. A power semiconductor circuit for driving a load connected to an output terminal, the circuit comprising:
an output switch in communication with said output terminal;
an internal state signal terminal in communication with an internal state switch;
an internal state sensor which detects the internal state of the circuit; and
a logic circuit in communication with said internal state sensor, a control terminal and said internal state signal terminal, wherein said logic circuit controls a state of said output switch and said internal state switch.

14. The circuit of claim 13, wherein said output switch is adapted to selectively provide power from a power input terminal based upon an output switch control signal from said logic circuit.

15. The circuit of claim 13, further comprising a drive circuit in communication with said logic circuit and said output switch, wherein said drive circuit is adapted to control said output switch in response to a control signal from said logic circuit.

16. The circuit of claim 13, wherein said internal state switch is in communication with a ground terminal and is responsive to a control signal from said logic circuit to selectively switch said internal state signal terminal into communication with said ground terminal.

17. The circuit of claim 13, wherein said logic circuit is adapted to control said internal state signal switch based upon a signal from said internal state sensor.

18. The circuit of claim 13, wherein said logic circuit is adapted to control said internal state signal switch based upon a signal from said control terminal.

19. The circuit of claim 13, wherein said logic circuit is adapted to control said internal state signal switch based upon a signal from said internal state signal terminal.

20. A power semiconductor circuit for driving a load connected to an output terminal, the circuit comprising:
a plurality of power semiconductor circuits each comprising:
an output switch in communication with said output terminal;
an internal state signal terminal in communication with an internal state switch;
an internal state sensor which detects the internal state of the circuit; and
a logic circuit in communication with said internal state sensor, a control terminal and said internal state signal terminal, wherein said logic circuit controls said output switch and said internal state switch.

* * * * *